US009612345B2

(12) United States Patent
Stowe et al.

(10) Patent No.: US 9,612,345 B2
(45) Date of Patent: Apr. 4, 2017

(54) VISIBLE SCINTILLATION PHOTODETECTOR DEVICE INCORPORATING CHALCOPYRITE SEMICONDUCTOR CRYSTALS

(71) Applicants: Ashley C. Stowe, Knoxville, TN (US); Arnold Burger, Nashville, TN (US)

(72) Inventors: Ashley C. Stowe, Knoxville, TN (US); Arnold Burger, Nashville, TN (US)

(73) Assignees: Cosolidated Nuclear Security, LLC, Reston, VA (US); Fisk University, Nashville, TN (US)

( * ) Notice: Subject to any disclaimer, the term of this patent is extended or adjusted under 35 U.S.C. 154(b) by 0 days.

(21) Appl. No.: 14/843,150

(22) Filed: Sep. 2, 2015

(65) Prior Publication Data

US 2015/0378031 A1    Dec. 31, 2015

Related U.S. Application Data

(63) Continuation-in-part of application No. 13/658,591, filed on Oct. 23, 2012, now Pat. No. 9,334,581.

(51) Int. Cl.
*G01T 1/20* (2006.01)
*C30B 11/12* (2006.01)
(Continued)

(52) U.S. Cl.
CPC .............. *G01T 1/20* (2013.01); *C30B 11/06* (2013.01); *C30B 11/12* (2013.01); *C30B 29/46* (2013.01)

(58) Field of Classification Search
CPC ........ G01T 1/2018; G01T 1/2006; G01T 1/00
See application file for complete search history.

(56) References Cited

U.S. PATENT DOCUMENTS 6,153,895 A * 11/2000 Watanabe ........... H01L 31/0322
257/101
7,456,405 B1 * 11/2008 Iwatschenko-Borho G01T 1/023
250/339.02
(Continued)

OTHER PUBLICATIONS

R. C. Smith, "Device Applications of the ternary semiconductor compounds," 1975, Journal De Physique, Colloque C3, supplement au No. 9, Tome 36, pp. C3-89 to C3-99.*
(Continued)

*Primary Examiner* — Kiho Kim
(74) *Attorney, Agent, or Firm* — Clements Bernard Walker PLLC; Christopher L. Bernard (57) ABSTRACT

A photodetector device, including: a scintillator material operable for receiving incident radiation and emitting photons in response; a photodetector material coupled to the scintillator material operable for receiving the photons emitted by the scintillator material and generating a current in response, wherein the photodetector material includes a chalcopyrite semiconductor crystal; and a circuit coupled to the photodetector material operable for characterizing the incident radiation based on the current generated by the photodetector material. Optionally, the scintillator material includes a gamma scintillator material and the incident radiation received includes gamma rays. Optionally, the photodetector material is further operable for receiving thermal neutrons and generating a current in response. The circuit is further operable for characterizing the thermal neutrons based on the current generated by the photodetector material.

19 Claims, 4 Drawing Sheets

(51) Int. Cl.
  *C30B 29/46* (2006.01)
  *C30B 11/06* (2006.01)

(56) References Cited

U.S. PATENT DOCUMENTS

| | | | |
|---|---|---|---|
| 7,687,780 B2 | 3/2010 | Bell et al. | |
| 8,378,444 B2* | 2/2013 | Miyazaki | H01L 31/0322 257/103 |
| 2003/0052701 A1* | 3/2003 | Brown | G01T 1/2018 250/370.11 |
| 2010/0102368 A1* | 4/2010 | Matsushima | H01L 27/14632 257/293 |
| 2013/0020488 A1* | 1/2013 | Flamanc | G01T 1/2018 250/362 |

OTHER PUBLICATIONS

Stowe et al., "Synthesis of a potential semiconductor neutron detector crystal LiGa(Se/Te)2: materials purity and compatibility effects," 2011, SPIE Proceedings, vol. 8142, pp. 81421H-1 to 81421H-8.*

O. Balachninaite, L. Petraviciute, M. Maciulevicius, V. Sirutkaitis, L. Isaenko, S. Lobanov, A. Yelisseyev, J.-J. Zondy; Absorptance and scattering losses measurements of the mid-infrared nonlinear crystals LiInSe2 and LiInS2 in the IR range.; ISSN 1392-2114 Ultragarsas Nr.3(60). 2006.

L. Isaenko, A. Yelisseyev, S. Lobanov, A. Titov, V. Petrov, J.-J. Zondy, P. Krinitsin, A. Merkulov, V. Vedenyapin, J. Smironova; "Growth and properties of LiGaX2 (X—S, Se, Te) single crystals for nonlinear optical applications in the mid-IR"; Crys. Res. Technol. 38, No. 3-5, 379-387 (2003) / DO1 10.1002/crat. 200310047.; 2003 WILEY-VCH Verlag GmbH & Co. KGaA, Wenheim 0232-1300/03/3-504-0379.

L. Isaenko, P. Krinitsin, V. Vedenyapin, A. Yelisseyev, A. Merkulov, J.-J. Xondy, and V. Petrov; "LiGaTe2: A New Highly Nonlinear Chalcopyrite Optical Crystal for the Mid-IR"; Crystal Growth & Design, vol. 5. No. 4 1325-1329, 2005.

* cited by examiner

VISIBLE SCINTILLATION PHOTODETECTOR DEVICE INCORPORATING CHALCOPYRITE SEMICONDUCTOR CRYSTALS

CROSS-REFERENCE TO RELATED APPLICATION

The present patent application/patent is a continuation-in-part (CIP) of co-pending U.S. patent application Ser. No. 13/658,591, filed on Oct. 23, 2012, and entitled "METHODS FOR SYNTHESIZING SEMICONDUCTOR QUALITY CHALCOPYRITE CRYSTALS FOR NONLINEAR OPTICAL AND RADIATION DETECTION APPLICATIONS AND THE LIKE," the contents of which are incorporated in full by reference herein.

STATEMENT REGARDING FEDERALLY SPONSORED RESEARCH OR DEVELOPMENT

The U.S. Government has rights to the present disclosure pursuant to Contract No. DE-NA0001942 between the U.S. Department of Energy and Consolidated Nuclear Security, LLC.

FIELD OF THE DISCLOSURE

The present disclosure relates generally to a visible scintillation photodetector device incorporating chalcopyrite semiconductor crystals coupled to a scintillation material. More specifically, the present disclosure relates to a visible scintillation photodetector device incorporating chalcopyrite semiconductor crystals coupled to a scintillation material that is capable of discriminating between scintillation photons from gamma rays and thermal neutrons when coupled to a gamma scintillation material.

BACKGROUND OF THE DISCLOSURE

Significant research has been conducted to create novel scintillators for the detection of ionizing radiation. The radiation interaction with the scintillation material produces photons at a discrete wavelength, which must be matched by a coupled photodetector to convert the photons into a measurable current. Photomultiplier tubes (PMTS) have typically been used for this conversion, as they are effective at concentrating the photons to produce a stronger electrical signal. In recent years, however, solid state photodetectors, such as silicon photomultipliers (SiPMs) and avalanche photodiodes (APDs), offer both solid state coupling and different wavelength ranges for the coupling of scintillation photons at high quantum yield. Solid state coupling offers significant power savings and cost reductions in the ultimate device, as well as potential size reductions. More recently, the chalcopyrite class of high-resistivity ternary semiconductor compounds has been proven useful as both nonlinear optical crystals and radiation detectors.

BRIEF SUMMARY OF THE DISCLOSURE

In various exemplary embodiments, the present disclosure provides a visible scintillation photodetector device that incorporates chalcopyrite semiconductor crystals coupled to a gamma scintillation material, so that the photodetector device is capable of discriminating between thermal neutrons and scintillation photons produced from gamma rays.

Thus, in the present disclosure, the chalcopyrite class of high-resistivity ternary semiconductor compounds is utilized as a photodetector that is coupled to a scintillator crystal that has high quantum yield in the visible range, "tuning" the photo-absorption wavelength in the visible range. Further, advantageously, when the chalcopyrite crystal is a $^6$Li-containing crystal, the semiconductor crystal also operates as a radiation detector. As such, the chalcopyrite photodetector can be bandgap "tuned" by alloying in a quaternary compound and then optically coupled to a gamma scintillator, such as $SrI_2(Eu)$, to convert scintillation photons generated via gamma interactions with the scintillator, as well as to detect neutrons incident on the chalcopyrite photodetector itself. The semitransparent metal electrical contacts on the photodetector surface enable visible photons emitted during the scintillation process to reach the chalcopyrite crystal. Scintillation photons are converted to an electrical pulse similar to a SiPM or APD. Neutrons will generate a significantly higher amount of current due to the large Q value of the $^6$Li($\alpha$,n) reaction. The timing of the current pulses is also used to discriminate between gamma and neutron detection pulses in the chalcopyrite crystal.

In one exemplary embodiment, the present disclosure provides a photodetector device, including: a scintillator material operable for receiving incident radiation and emitting photons in response; a photodetector material coupled to the scintillator material operable for receiving the photons emitted by the scintillator material and generating a current in response, wherein the photodetector material includes a chalcopyrite semiconductor crystal; and a circuit coupled to the photodetector material operable for characterizing the incident radiation based on the current generated by the photodetector material. The scintillator material includes one or more of $SrI_2(Eu)$, BGO, $LaBr_3$, LSO, or any other compound that emits scintillation photons of a wavelength that overlaps with the absorption spectrum of the chalcopyrite compound. The photodetector material includes one or more of $^6LiInSe_2$, $^6LiGaSe_2$, $^6LiInTe_2$, $^6LiIn_{(1-x)}Ga_{(x)}Se_2$, $^6LiInS_2$, $^6LiGaS_2$, $^6LiGaTe_2$, or another $^6$Li-containing chalcopyrite. The photons emitted by the scintillator material include visible photons. Optionally, the scintillator material includes a gamma scintillator material and the incident radiation received includes gamma rays. Optionally, the photodetector material is further operable for receiving thermal neutrons and generating a current in response. The circuit is further operable for characterizing events generated by the thermal neutrons and discriminating them from those events generated by gamma photons based on the characteristics (e.g., amplitude, risetime, and falltime) of the current pulse produced by the photodetector material.

In another exemplary embodiment, the present disclosure provides a photodetector method, including: providing a scintillator material operable for receiving incident radiation and emitting photons in response; providing a photodetector material coupled to the scintillator material operable for receiving the photons emitted by the scintillator material and generating a current in response, wherein the photodetector material includes a chalcopyrite semiconductor crystal; and characterizing the incident radiation based on the current generated by the photodetector material using a circuit coupled to the photodetector material. The scintillator material includes one or more of $SrI_2(Eu)$, BGO, $LaBr_3$, LSO, or any other compound that emits scintillation photons of a wavelength that overlaps with the absorption spectrum of the chalcopyrite compound. The photodetector material includes one or more of $^6LiInSe_2$, $^6LiGaSe_2$, $^6LiInTe_2$, $^6LiIn_{(1-x)}Ga_{(x)}Se_2$, or another $^6$Li-containing chalcopyrite.

The photons emitted by the scintillator material include visible photons. Optionally, the scintillator material includes a gamma scintillator material and the incident radiation received includes gamma rays. Optionally, the photodetector material is further operable for receiving thermal neutrons and generating a current in response. The method further includes characterizing events generated by the thermal neutrons and discriminating them from those generated by gamma photons based on the characteristics (e.g., amplitude, risetime, and falltime) of the current pulse produced by the photodetector material.

In a further exemplary embodiment, the present disclosure provides a photodetector device, including: a scintillator material operable for receiving first incident radiation and emitting photons in response; a photodetector material coupled to the scintillator material operable for receiving the photons emitted by the scintillator material and generating a current in response and operable for receiving second incident radiation and generating a current in response, wherein the photodetector material includes a chalcopyrite semiconductor crystal; and a circuit coupled to the photodetector material operable for characterizing the first incident radiation and the second incident radiation based on the currents generated by the photodetector material. The scintillator material includes one or more of $SrI_2(Eu)$, BGO, $LaBr_3$, LSO, or any other compound that emits scintillation photons of a wavelength that overlaps with the absorption spectrum of the chalcopyrite compound. The photodetector material includes one or more of $^6LiInSe_2$, $^6LiGaSe_2$, $^6LiInTe_2$, $^6LiIn_{(1-x)}Ga_{(x)}Se_2$, or another $^6Li$-containing chalcopyrite. The photons emitted by the scintillator material include visible photons. Optionally, the scintillator material includes a gamma scintillator material and the first incident radiation received by the scintillator material includes gamma rays. Optionally, the second incident radiation received by the photodetector material includes thermal neutrons.

BRIEF DESCRIPTION OF THE DRAWINGS

The present disclosure is illustrated and described herein with reference to the various drawings, in which like reference numbers are used to denote like device components/method steps, as appropriate, and in which.

DETAILED DESCRIPTION OF THE DISCLOSURE

By way of background, related to U.S. Pat. No. 7,687,780 (Bell et al.), the detecting element includes a compound having the composition I-III-VI2 or II-IV-V2, where the "I" component is from columns 1A or 1B of the periodic table, the "II" component is from column 2B of the periodic table, the "III" component is from column 3A of the periodic table, the "IV" component is from column 4A of the periodic table, the "V" component is from column 5A of the periodic table, and the "VI" component is from column 6A of the periodic table. A more concise manner of description is that the crystal is formed from elements in the groups of 1A-3A-6A, 1B-3A-6A, or 2B-4A-5A of the periodic table. An example from group 1A-3A-6A is lithium-gallium-selenium. An example from group 1B-3A-6A is copper-gallium-selenium. An example from group 2B-4A-5A is cadmium-germanium-antimony. Crystals formed from groups 1B-3A-6A and 2B-4A-5A are chalcopyrites. The detecting element detects ionizing electromagnetic radiation by generating a signal proportional to the energy deposited in the element, and detects neutrons by virtue of the ionizing electromagnetic radiation emitted by one or more constituent materials subsequent to capture. The detector may contain more than one neutron sensitive element.

The detecting system generally includes a semiconductor crystal onto which conducting electrodes are deposited on opposing surfaces of the crystal. The semiconductor material may be intrinsic material or doped to produce intrinsic material. Intrinsic material, when referring to semiconductors, refers to a semiconductor material in which the majority and minority charge carriers in the material are balanced and the material does not display either negative (n-) or positive (p-) type conductivity. Doping is the process of introducing small amounts of impurities (typically in the amount of parts per million (ppm)) for the purpose of altering the electrical properties of the material to force a desired density of positive and negative charge carriers. The electrical contacts may be ohmic, or may be Schottky. An ohmic contact is a metal semiconductor contact with very low resistance independent of the polarity of the applied voltage. A Schottky contact is a metal semiconductor contact used to form a potential barrier. The resulting detecting element forms a p-n or p-i-n diode, or simply a bulk semiconducting material.

In a preferred embodiment of a detector, a voltage is applied between the electrodes by a suitable means, such as a battery. A resistor is provided in line between one of the electrodes and the battery. Any signal generated in response to radiation is extracted through a junction between the crystal and the resistor. If the detecting element is simply bulk semiconducting material, then the polarity of the voltage with respect to the resistor is of no consequence. Although the resistor connected between the negative terminal of the battery and the crystal is contemplated, the resistor may also be connected between the positive terminal of the battery and the crystal, with the signal taken from the junction between the resistor and the crystal. If the crystal is realized as a diode (p-n, p-i-n, or Schottky), then the connection must be such that the diode is reverse biased by the battery.

When the crystal is exposed to ionizing electromagnetic radiation, electron-hole pairs are created in the bulk of the material. These charges are separated by the applied voltage and the resulting charge pulse is sensed as a current pulse or a voltage pulse. The amplitude of the charge pulse is proportional to the energy deposited in the crystal by the radiation. In this mode of operation, the crystal realizes a detector of alpha, beta, gamma, and x-ray radiation, in addition to cosmic rays.

In one arrangement, the crystal may be fabricated with one element that reacts with neutrons and subsequently emits ionizing electromagnetic radiation. The crystal then also serves to detect neutrons. For example, if the "I"

element is silver (Ag), an element from column 1B of the periodic table, then exposure to neutrons results in transmutation of the silver nuclei to radioisotopes with short half lives. These isotopes decay by the emission of beta particles (electrons), which create ionization in the detector just as would radiation originating outside the detecting element. Analysis of the spectrum of pulse amplitudes and the temporal behavior of the count rate yields a signature of the presence of neutrons.

In another arrangement, if the "I" element is lithium, an element from column 1A of the periodic table, then exposure to neutrons results in the exothermic reaction $^6Li(n,\alpha)3H$. The energetic triton and alpha particles liberate charge as they decelerate, ultimately depositing their entire energy in the crystal. Analysis of the resulting spectrum of pulse amplitudes yields a signature of the presence of neutrons.

In a further arrangement, if the "III" (3A) element of the crystal is indium (In), behavior similar to that described for silver is observed. In a still further arrangement, more than one element may be neutron sensitive. For example, if both silver and indium are used, then multiple half lives are observed in the count rate, and spectra of beta particles characteristic of both elements are observed in the pulse height spectrum. Analysis of such data can give information on the spectral characteristics of the incident neutron flux.

In operation, the semiconductor radiation detecting apparatus works in the following manner. Means are provided to convert current or charge pulses to a digital value. The electrical charge signal generated in response to radiation passes from the junction through a capacitor to a charge integrating pre-amplifier whose output signal, in turn, is directed to a shaping amplifier. The shaping amplifier produces an approximately Gaussian shaped pulse. The pulse is directed to an analog-to-digital converter (ADC), which translates the analog voltage developed by the shaping amplifier into a digital value. The digital values from the converter are directed to a processor and display. The processor records the number of times each value occurs during a measurement. This accumulates a histogram of the magnitudes of the pulses produced by the incident radiation. The processor compares these values to known values and provides an indication of the incident radiation based on the comparison. The use of the amplifiers, converter, and processor to condition signals and create an indication of the incident radiation is well known to those of ordinary skill in the art and does not require detailed explanation.

In an alternate embodiment, the pre-amplifier simply provides gain without integration and the shaping amplifier is replaced by a voltage comparator and gated integrator. The voltage comparator triggers the gated integrator to integrate the voltage pulse from the pre-amplifier. The gated integrator signals the ADC to perform a conversion when the integration period is complete. The processor and display perform the same functions as described above.

In another alternate embodiment, a battery supplies bias to the crystal. The charge generated by incident radiation in the crystal is separated by the potential developed by the virtual ground at the inverting terminal of the operational amplifier, and the resulting current pulse is forced through a feedback resistor. In this manner, the current pulse is converted to a voltage pulse and is then directed to the pre-amplifier.

These crystals are useful as radiation detectors, and as semiconductors, for the following reasons. Carrier mobility in the range of 500-10,000 $cm^2/V$-s has been reported and band gaps between 1.2 and 2.7 eV have been produced. These values are comparable to or better than those of germanium and indicate that performance at room temperature exceeds that of CZT. In addition, some of the constituent materials have high neutron absorption cross sections, conferring simultaneous sensitivity to ionizing electromagnetic radiation and neutrons.

There are a number of advantages to using chalcopyrites. There is a ready availability of high purity, oriented, crack free, single chalcopyrite crystals produced for use in optical applications. These crystals are used in infrared nonlinear optical equipment to effect second harmonic generation or optical parametric oscillation. The finished materials have improved properties that should continue to improve as a result of research and development spurred by the interest of the military in using chalcopyrites in high powered lasers. Chalcopyrites have physical properties that permit their use as semiconductor radiation detectors at room temperature. As such, they operate according to the same physics as do silicon, CZT, and mercuric iodide. However, they differ from these materials in that the average atomic number is much larger than silicon, making them useful at higher energies than silicon. They can be grown in large, crack free single crystal boules (unlike CZT and mercuric iodide). Further, the neutron absorber density is large and average Z number is low compared to CZT, for example, such that high neutron detection efficiencies can be realized using thin crystals, thereby minimizing gamma interference in the chalcopyrite crystals. They also are an improvement over mercuric iodide in that the use of mercuric iodide is limited to applications in which the temperature does not exceed 80 degrees C., while chalcopyrites can withstand temperatures up to several hundred degrees C.

Without limitation, it may be advantageous to deposit more than two electrodes onto the crystal to control the shape of the internal electric field. In another example, sandwiching the crystal between spring loaded contacts enables the application of a voltage without the deposition of electrodes. In yet another example, the pre-amplifier, shaping amplifier, and ADC may be replaced by a charge-to-digital converter.

Figure 1:
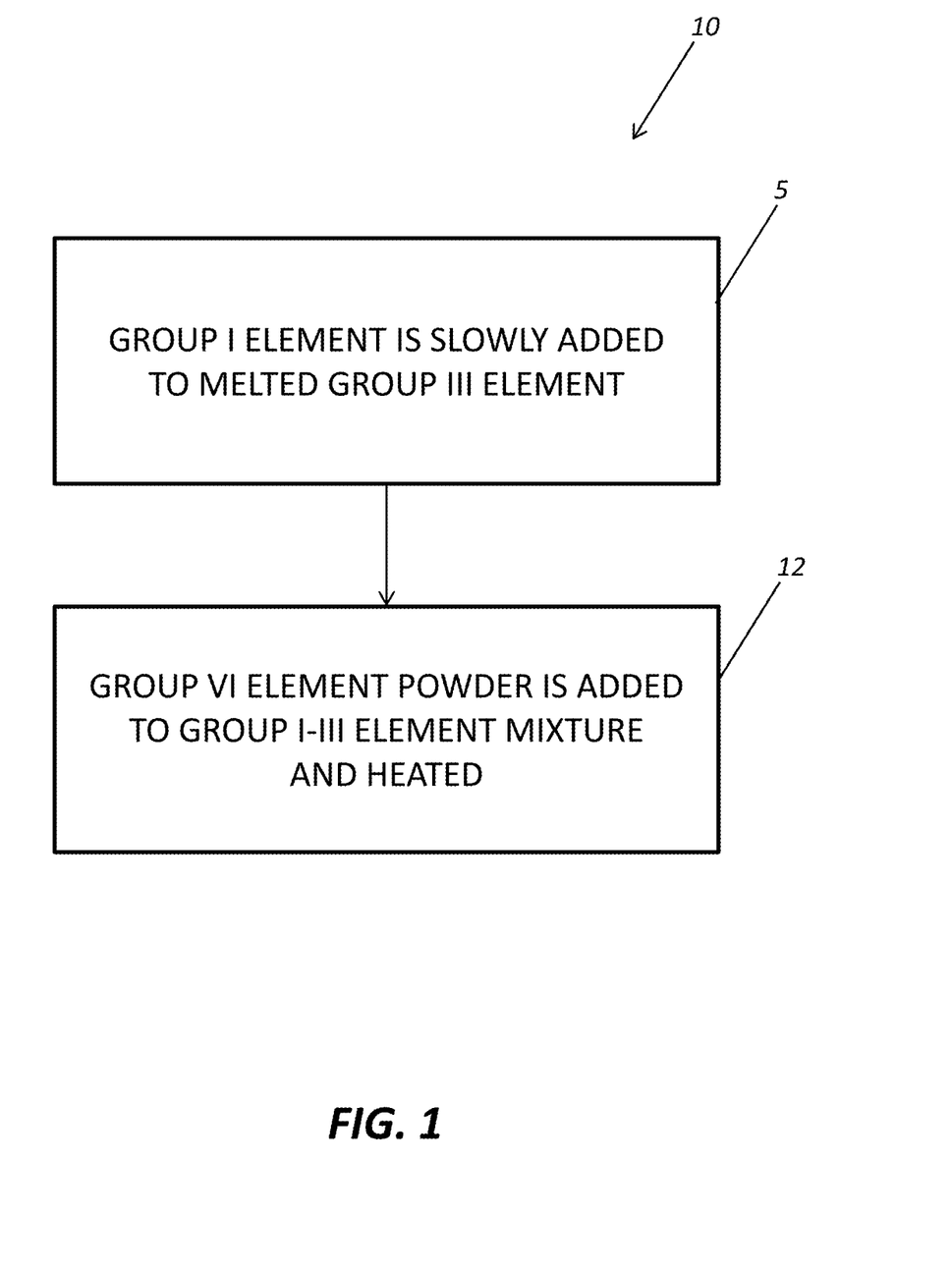
FIG. 1 is a flowchart illustrating one exemplary embodiment of the method for synthesizing I-III-VI$_2$ compounds of the present disclosure, specifically utilizing a heating process.
Figure 2:
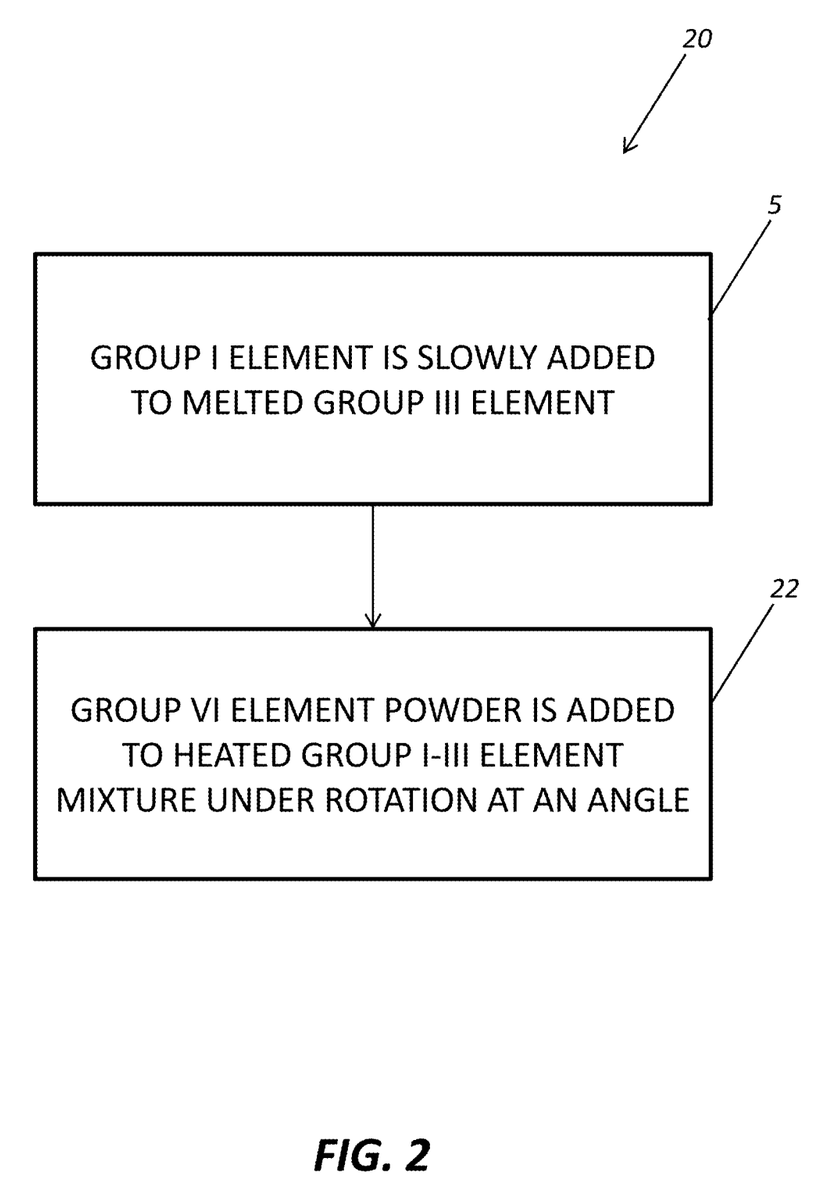
FIG. 2 is a flowchart illustrating another exemplary embodiment of the method for synthesizing I-III-VI$_2$ compounds of the present disclosure, specifically utilizing a mixing process.
Figure 3:
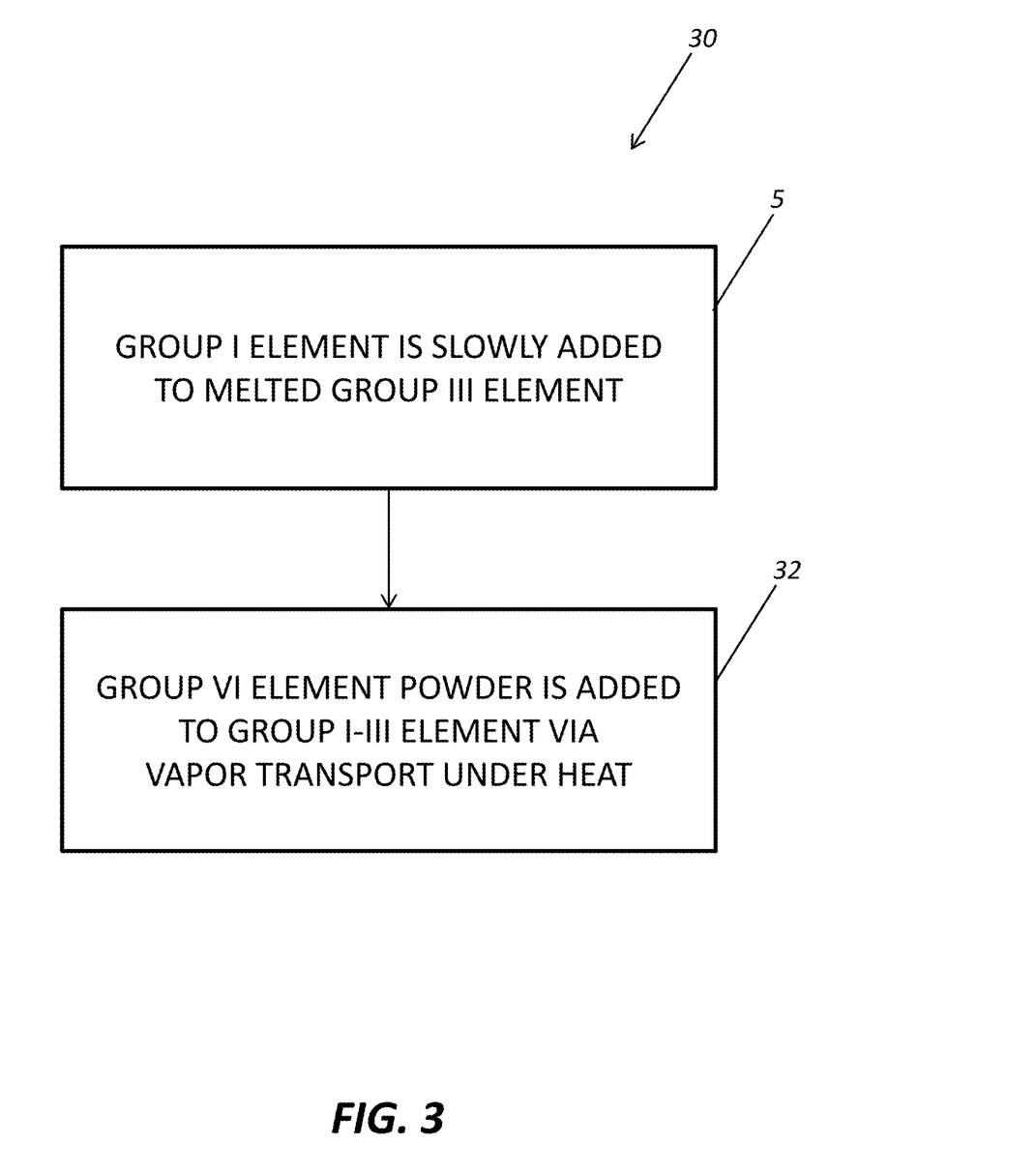
FIG. 3 is a flowchart illustrating a further exemplary embodiment of the method for synthesizing I-III-VI$_2$ compounds of the present disclosure, specifically utilizing a vapor transport process.

In view of the above, the present disclosure involves separating I-III-$VI_2$ synthesis from the constituent elements into two distinct steps, and three associated embodiments are contemplated. The highest quality elemental starting materials are required to achieve successful synthesis of I-III-$VI_2$ compounds. Group I elements typically have the lowest purities as starting materials. Referring to FIGS. 1-3, in all exemplary embodiments, the most reactive element (Group I) is reacted with the Group III element, forming a binary alloy with equal stoichiometry 5. The Group III element is melted in a crucible under inert atmosphere for increased safety and purity. The Group I element is then slowly added to the melt, allowing the small amount of Group I element to react before another addition. This process minimizes overheating of the reaction, thereby minimizing additional alloy stoichiometries to form in the melt. The result is a highly crystalline, single phase I-III material. Two moles of a Group VI element are then added to the I-III compound at elevated temperature to form the chalcopyrite I-III-$VI_2$. The method by which the Group VI element is added is different in each of the three exemplary embodiments.

Referring specifically to FIG. 1, in the first exemplary embodiment 10, the Group VI elemental powder is added directly to the I-III alloy and heated to 700-900 degrees C. (depending on the group VI element) in a crucible 12. The reaction is allowed to proceed to completion and then cooled. Because the I-III compound is formed in an initial reaction step, the stoichiometry is defined as one mole for each element. Addition of the Group VI element for the final I-III-VI$_2$ reaction has lower overall stoichiometric variability throughout the charge.

Referring specifically to FIG. 2, in the second exemplary embodiment 20, the addition of the Group VI element into a single crucible is as with the first exemplary embodiment; however, the constituents are mixed at elevated temperature with constant crucible rotation at an angle 22, for example at an angle of about 20 degrees. Rotation further promotes mixing during the synthesis to reduce phase variability.

Referring specifically to FIG. 3, the third exemplary embodiment 30 involves vapor transport of the Group VI element 32. The previously prepared I-III compound is placed in one well of a crucible, while the Group VI element is placed in an adjacent well. As the mixture is heated to 700-900 degrees C., the Group VI element slowly vaporizes and is transported through thermal currents to the melted group I-III well. The reaction then occurs to form I-III-VI$_2$. Vapor transport further slows the reaction to minimize overheating and promote a single phase synthetic charge.

It should be noted that the methods of the present invention are not limited to the synthesis of semiconductor materials. Doping with an activator (e.g., a Group IV element) may be performed to create a scintillator material, for example.

Figure 4:
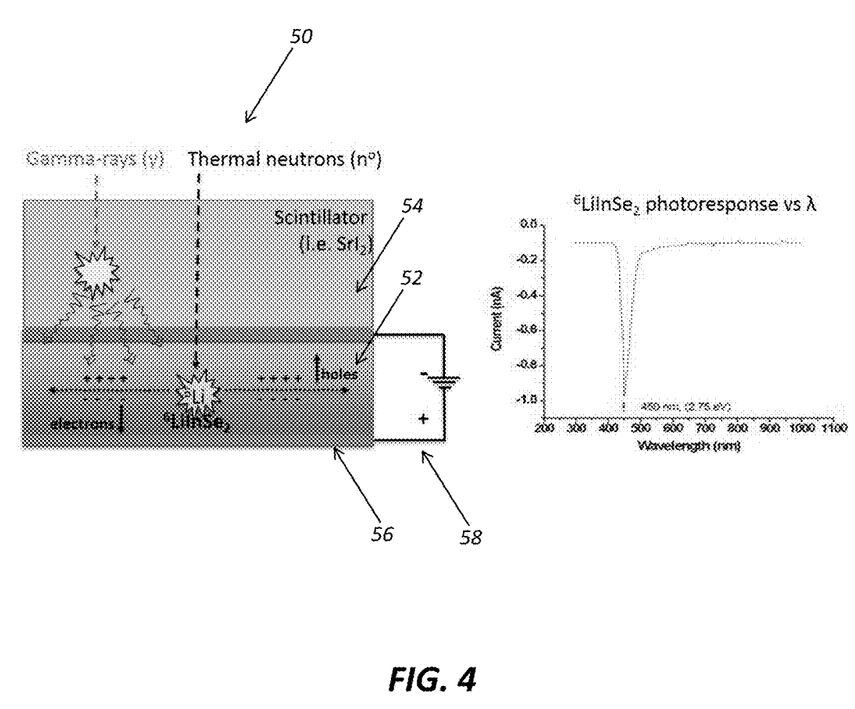
FIG. 4 is a schematic diagram illustrating one exemplary embodiment of the visible scintillation photodetector device of the present disclosure.

Referring now specifically to FIG. 4, in one exemplary embodiment of the disclosure, the chalcopyrite semiconductor crystal 52 is utilized as a photodetector device 50 when coupled to a scintillator material 54. Optionally, the chalcopyrite semiconductor crystal 52 is coupled to a gamma scintillator material 54, whereby the scintillation photons produced through the gamma interaction in the gamma scintillator material 54 are received and converted to an electrical signal by the chalcopyrite semiconductor crystal 52. Thus far, $^6$LiInSe$_2$ has been tested and detects photons in a narrow band around 450 nm, requiring the scintillator material 54 to emit photons between 400-500 nm. There are a number of scintillators that emit in this wavelength range, including SrI$_2$(Eu) and BGO. Further, when $^6$Li is included in the photodetector device 50, a dual detector is created. A gamma flux is detected via the scintillation material 54, which also acts as a gamma shield, preventing any convoluting signal on the chalcopyrite photodetection function. The chalcopyrite semiconductor crystal 52 also acts as a neutron detection semiconductor, as described herein above, producing a current with a different timing from the photodetection function. Thus, the gamma and neutron signals can be discriminated. It will be readily apparent to those of ordinary skill in the art, however, that the photodetector device 50 is not limited to these exemplary materials. In general, the chalcopyrite semiconductor crystal 52 can include, for example, $^6$LiInSe$_2$, $^6$LiInS$_2$, $^6$LiInTe$_2$, $^6$LiGaSe$_2$, $^6$LiGaS$_2$, or $^6$LiGaTe$_2$. The scintillator material 54 can include, for example, SrI$_2$(Eu), BGO, LaBr$_3$, or LSO. The preferred thickness range for the chalcopyrite semiconductor crystal 52 is between about 0.2 mm and about 2 mm. The preferred thickness range for the scintillator material 54 is between about 5 mm and about 30 mm. Preferably, the scintillator material 54 emits and the chalcopyrite semiconductor crystal 52 receives photons in a wavelength range of between about 400 nm and about 550 nm. Further, as is apparent from FIG. 4, appropriate electrodes 56 and circuitry 58 are provided to accomplish the detection function, as described herein above. The metal electrodes 56 on the photodetector surface are configured such that scintillation photons are able to reach the chalcopyrite semiconductor crystal 52 for collection.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims.

What is claimed is:

1. A photodetector device, comprising:
 a scintillator material operable for receiving incident radiation and emitting photons in response, wherein the scintillator material comprises a gamma scintillator material and the incident radiation received comprises gamma rays;
 a photodetector material coupled to the scintillator material operable for receiving the photons emitted by the scintillator material and generating a current in response, wherein the photodetector material comprises a chalcopyrite semiconductor single crystal material; and
 a circuit coupled to the photodetector material operable for characterizing the incident radiation based on the current generated by the photodetector material;
 wherein the photodetector material has a thickness of between 0.2 mm and 2 mm and the scintillator material has a thickness of between 5 mm and 30 mm such that the scintillator material shields the photodetector material from gamma rays.

2. The photodetector device of claim 1, wherein the scintillator material comprises one or more of SrI$_2$(Eu), BGO, LaBr$_3$, and LSO.

3. The photodetector device of claim 1, wherein the photodetector material comprises one or more of $^6$LiInSe$_2$, $^6$LiInS$_2$, $^6$LiInTe$_2$, $^6$LiGaSe$_2$, $^6$LiGaS$_2$, $^6$LiGaTe$_2$, and $^6$LiIn$_{(1-x)}$Ga$_{(x)}$Se$_2$.

4. The photodetector device of claim 1, wherein the photodetector material is further operable for receiving thermal neutrons and generating a current in response.

5. The photodetector device of claim 4, wherein the circuit is further operable for characterizing the thermal neutrons based on the current generated by the photodetector material.

6. The photodetector device of claim 1, wherein the photons emitted by the scintillator material comprise visible photons having a wavelength between 400 nm and 550 nm.

7. The photodetector device of claim 1, wherein the chalcopyrite semiconductor single crystal material is a I-III-VI$_2$ compound formed by:
 melting a Group III element;
 subsequently adding a Group I element to the melted Group III element at a rate that allows the Group I and Group III elements to react thereby providing a single phase I-III compound;
 subsequently adding a Group VI element to the single phase I-III compound and heating; and
 growing a bulk crystal from the resulting I-III-VI$_2$ compound without using a seed crystal.

8. A photodetector method, comprising:
 providing a scintillator material operable for receiving incident radiation and emitting photons in response, wherein the scintillator material comprises a gamma scintillator material and the incident radiation received comprises gamma rays;

providing a photodetector material coupled to the scintillator material operable for receiving the photons emitted by the scintillator material and generating a current in response, wherein the photodetector material comprises a chalcopyrite semiconductor single crystal material; and characterizing the incident radiation based on the current generated by the photodetector material using a circuit coupled to the photodetector material;

wherein the photodetector material has a thickness of between 0.2 mm and 2 mm and the scintillator material has a thickness of between 5 mm and 30 mm such that the scintillator material shields the photodetector material from gamma rays.

9. The photodetector method of claim 8, wherein the scintillator material comprises one or more of $SrI_2(Eu)$, BGO, $LaBr_3$, and LSO.

10. The photodetector method of claim 8, wherein the photodetector material comprises one or more of $^6LiInSe_2$, $^6LiInS_2$, $^6LiInTe_2$, $^6LiGaSe_2$, $^6LiGaS_2$, $^6LiGaTe_2$, and $^6LiIn_{(1-x)}Ga_{(x)}Se_2$.

11. The photodetector method of claim 8, wherein the photodetector material is further operable for receiving thermal neutrons and generating a current in response.

12. The photodetector method of claim 11, further comprising characterizing the thermal neutrons based on the current generated by the photodetector material using the circuit coupled to the photodetector material.

13. The photodetector method of claim 8, wherein the photons emitted by the scintillator material comprise visible photons having a wavelength between 400 nm and 550 nm.

14. The photodetector method of claim 8, wherein the chalcopyrite semiconductor single crystal material is a I-III-$VI_2$ compound formed by:
melting a Group III element;
subsequently adding a Group I element to the melted Group III element at a rate that allows the Group I and Group III elements to react thereby providing a single phase I-III compound;
subsequently adding a Group VI element to the single phase I-III compound and heating; and
growing a bulk crystal from the resulting I-III-$VI_2$ compound without using a seed crystal.

15. A photodetector device, comprising:
a scintillator material operable for receiving first incident radiation and emitting photons in response, wherein the scintillator material comprises a gamma scintillator material and the first incident radiation received comprises gamma rays;
a photodetector material coupled to the scintillator material operable for receiving the photons emitted by the scintillator material and generating a current in response and operable for receiving second incident radiation comprising thermal neutrons and generating a current in response, wherein the photodetector material comprises a chalcopyrite semiconductor single crystal material; and
a circuit coupled to the photodetector material operable for characterizing the first incident radiation and the second incident radiation based on the currents generated by the photodetector material;
wherein the photodetector material has a thickness of between 0.2 mm and 2 mm and the scintillator material has a thickness of between 5 mm and 30 mm such that the scintillator material shields the photodetector material from gamma rays.

16. The photodetector device of claim 15, wherein the scintillator material comprises one or more of $SrI_2(Eu)$, BGO, $LaBr_3$, and LSO.

17. The photodetector device of claim 15, wherein the photodetector material comprises one or more of $^6LiInSe_2$, $^6LiInS_2$, $^6LiInTe_2$, $^6LiGaSe_2$, $^6LiGaS_2$, $^6LiGaTe_2$, and $^6LiIn_{(1-x)}Ga_{(x)}Se_2$.

18. The photodetector device of claim 15, wherein the photons emitted by the scintillator material comprise visible photons having a wavelength between 400 nm and 550 nm.

19. The photodetector device of claim 15, wherein the chalcopyrite semiconductor single crystal material is a I-III-$VI_2$ compound formed by:
melting a Group III element;
subsequently adding a Group I element to the melted Group III element at a rate that allows the Group I and Group III elements to react thereby providing a single phase I-III compound;
subsequently adding a Group VI element to the single phase I-III compound and heating; and
growing a bulk crystal from the resulting I-III-$VI_2$ compound without using a seed crystal.

* * * * *